US010474789B2

(12) United States Patent
Ethington et al.

(10) Patent No.: US 10,474,789 B2
(45) Date of Patent: Nov. 12, 2019

(54) PREDICTION METHODS AND SYSTEMS FOR STRUCTURAL REPAIR DURING HEAVY MAINTENANCE OF AIRCRAFT

(71) Applicant: The Boeing Company, Chicago, IL (US)

(72) Inventors: James M. Ethington, St. Charles, MO (US); Liessman Sturlaugson, Chesterfield, MO (US)

(73) Assignee: The Boeing Company, Chicago, IL (US)

( * ) Notice: Subject to any disclaimer, the term of this patent is extended or adjusted under 35 U.S.C. 154(b) by 252 days.

(21) Appl. No.: 15/192,700

(22) Filed: Jun. 24, 2016

(65) Prior Publication Data
US 2017/0372000 A1 Dec. 28, 2017

(51) Int. Cl.
*G06F 17/50* (2006.01)
*G06N 5/02* (2006.01)

(52) U.S. Cl.
CPC ........ *G06F 17/5095* (2013.01); *G06N 5/022* (2013.01)

(58) Field of Classification Search
None
See application file for complete search history.

(56) References Cited

U.S. PATENT DOCUMENTS

| | | | |
|---|---|---|---|
| 7,693,900 B2 | 4/2010 | Wilmering et al. | |
| 7,953,506 B2 * | 5/2011 | Tookey | G06F 17/5095 |
| | | | 264/512 |
| 8,165,968 B2 | 4/2012 | Ramesh et al. | |
| 8,180,750 B2 | 5/2012 | Wilmering et al. | |
| 8,296,252 B2 | 10/2012 | Bernard | |

(Continued)

FOREIGN PATENT DOCUMENTS

WO    WO 01/95174    12/2001

OTHER PUBLICATIONS

"Model Training and Tuning," Dec. 31, 2014, downloaded from topepo.github.io/caret/training on May 4, 2015.

(Continued)

*Primary Examiner* — Craig C Dorais
(74) *Attorney, Agent, or Firm* — Dascenzo Intellectual Property Law, P.C.

(57) ABSTRACT

Hybrid feature selection methods include methods of creating a predictive model for structural repair during heavy maintenance in a fleet of aircraft. Methods include qualifying a qualification dataset of fatigue-related parameters calculated from data collected during a first group of flights of a first aircraft that experience a replacement of a structural component during heavy maintenance. Methods include receiving a qualified selection of the fatigue-related parameters and verifying a verification dataset of the qualified selection of the fatigue-related parameters calculated from data collected during a second group of flights of a second aircraft that experienced heavy maintenance without replacement of the structural component. Methods include receiving a set of verified and qualified fatigue-related parameters and building a predictive model for structural repair during heavy maintenance with a training dataset of the verified and qualified fatigue-related parameters calculated from data collected during additional flights of the fleet.

19 Claims, 4 Drawing Sheets

(56) References Cited

U.S. PATENT DOCUMENTS

| | | | |
|---|---|---|---|
| 8,370,280 | B1 | 2/2013 | Lin et al. |
| 8,494,824 | B2 | 7/2013 | Schmitz et al. |
| 8,955,365 | B2 | 2/2015 | do Amaral et al. |
| 9,037,320 | B1 | 5/2015 | Kesler et al. |
| 9,547,944 | B2 | 1/2017 | Nelson et al. |
| 9,617,010 | B2 | 4/2017 | Conrad |
| 2007/0093130 | A1 | 4/2007 | Shiraishi et al. |
| 2008/0021604 | A1 | 1/2008 | Bouvier et al. |
| 2008/0154458 | A1 | 6/2008 | Brandstetter et al. |
| 2009/0055339 | A1 | 2/2009 | Bernard |
| 2010/0241596 | A1 | 9/2010 | Lee et al. |
| 2012/0221193 | A1 | 8/2012 | Delaye et al. |
| 2013/0275059 | A1* | 10/2013 | Bernhard ............ G05B 23/0221 702/42 |
| 2015/0324501 | A1 | 11/2015 | Desell et al. |
| 2016/0259873 | A1* | 9/2016 | Kessie ................ G06F 17/5018 |
| 2016/0300156 | A1 | 10/2016 | Bowers et al. |
| 2017/0166328 | A1 | 6/2017 | Ethington et al. |
| 2017/0369190 | A1 | 12/2017 | Ethington et al. |
| 2018/0136995 | A1 | 5/2018 | Sheppard et al. |

OTHER PUBLICATIONS

"The caret Package," Dec. 31, 2014, downloaded from topepo.github.io/caret/index on May 4, 2015.

"Compare Multi-Class Classifiers: Letter Recognition," Microsoft Cortana Intelligence Gallery, Sep. 2, 2014, downloaded from gallery.cortanaintelligence.com/Experiment/Compare-Multi-class-Classifiers-Letter-recognition-2 on Jun. 24, 2016.

Gary Ericson, "Walkthrough Step 4: Train and Evaluate the Predictive Analytic Models," Microsoft, Apr. 22, 2015, downloaded from azure.microsoft.com/en-us/documentation/articles/ machine-learning-walkthrough-4-train-and-evaluate-models on May 4, 2015.

R. Caruana et al., "Ensemble Selection from Libraries of Models," Proceedings of the 21$^{st}$ International Conference on Machine Learning, Banff, Canada, Jul. 4-8, 2004.

C. Merkwirth et al., "A Short Introduction to ENTOOL," Jan. 14, 2003, pp. 1-11. Downloaded from j-wichard.de/entool/ on Mar. 14, 2017.

Ghobbar, A. et al., Evaluation of forecasting methods for intermittent parts demand in the field of aviation: a predictive model, ScienceDirect Elsevier Computers & Operations Research, vol. 30, Issue 14, Dec. 2003, pp. 2097-2114, Dec. 2003.

Byington, C. et al., Data-driven neural network methodology to remaining life predictions for aircraft actuator components, 2004 IEEE Aerospace Conference Proceedings (IEEE Cat. No. 04TH8720), pp. 3581-3589, 2004.

Yan, W., Application of Random Forest to Aircraft Engine Fault Diagnosis, IMACS Multiconference on "Computational Engineering in Systems Applications" (CESA), vol. 1, pp. 468-475, Oct. 4-6, 2006.

Lienhardt, B. et al., Design Forum Failure-Finding Frequency for a Repairable System Subject to Hidden Failures, Journal of Aircraft, vol. 45, No. 5, pp. 1804-1809, Sep.-Oct. 2008.

Soares, S. et al., Comparison of a genetic algorithm and simulated annealing for automatic neural network ensemble development, Neurocomputing, vol. 121, pp. 498-511, Jun. 11, 2013.

Shevach, G. et al., Towards Performance Prognostics of a Launch Valve, Annual Conference of the Prognostics and Health Management Society 2014, pp. 62-69, 2014.

Hall et al., The WEKA Data Mining Software: An Update, SIGKDD Explorations, vol. 11, Issue 1, pp. 10-18, 2009.

European Patent Office, Extended European Search Report for related European patent application EP 17170615, dated Jul. 19, 2017.

Kählert, "Specification and Evaluation of Prediction Concepts in Aircraft Maintenance," Dissertation D17, Technische Universität Darmstadt, Apr. 4, 2017.

Wei, "Prediction of the Aircraft Fault Maintenance Sorties Based on Least Squares of Linear Regression," 2012 3rd International Conference on System Science, Engineering Design and Manufacturing Informatization, pp. 223-225, Oct. 20, 2012.

\* cited by examiner

PREDICTION METHODS AND SYSTEMS FOR STRUCTURAL REPAIR DURING HEAVY MAINTENANCE OF AIRCRAFT

FIELD

The present disclosure relates to prediction methods and systems for structural repair during heavy maintenance of aircraft.

BACKGROUND

Aircraft include structural components, such as the airframe, that generally are designed to last the service life of the aircraft. However, some components may not react to the stresses of use and the environment as expected and some aircraft may be used beyond the originally designed service life. In such cases, repair or replacement of structural components not originally designed to be repaired or replaced may cause significant downtime for individual aircraft while the affected structural components are repaired or reproduced for replacement.

For example, the F/A-18 Hornet model of aircraft was first placed into operational service in 1983. Now more than 30 years later, the majority of F/A-18 Hornet aircraft in service are operated at or beyond their originally designed service life (6,000-8,000 hours). Continued operation relies on a structured approach to inspection, maintenance, and repair that includes airframe repair and replacement. Airframe inspection, repair, and replacement are performed during cycles of heavy maintenance. During heavy maintenance, the airframe and other structural components are inspected for mechanical wear, heat damage, corrosion, and other signs of component fatigue. Though heavy maintenance commonly results in repair or replacement of some structural components, predicting which components will need repair or replacement in a particular aircraft is very difficult with current technology. Hence, maintaining the F/A-18 Hornet fleet in serviceable condition leads to new and variable demand for a large number of airframe and other structural components that were not originally designed to be repaired or replaced. Additionally, heavy maintenance results in unpredictable downtime for individual aircraft due to the variable demand for repaired or replacement components and the time to repair, reproduce, and/or replace the affected components.

SUMMARY

Hybrid feature selection methods include methods of creating a predictive model for structural repair during heavy maintenance in a fleet of aircraft that each includes a structural component. Methods include qualifying a qualification dataset of fatigue-related parameters calculated from data collected during a first group of flights of a first aircraft that experienced a replacement of the structural component during heavy maintenance. Each flight of the first group of flights occurred before the heavy maintenance and the first aircraft experienced an overstress event during each of the flights. Qualifying includes calculating and displaying the qualification dataset.

Methods include receiving a qualified selection of the fatigue-related parameters, generally based on a user's determination of a correlation between the structural repair during heavy maintenance and the fatigue-related parameters. Methods include verifying a verification dataset of the qualified selection of the fatigue-related parameters calculated from data collected during a second group of flights of a second aircraft that experienced heavy maintenance without replacement of the structural component. Each flight of the second group of flights occurred before the heavy maintenance and the second aircraft experienced an overstress event during each of the flights. Verifying includes calculating and displaying the verification dataset.

Methods include receiving a set of verified and qualified fatigue-related parameters, generally based on a user's determination of a correlation (or lack thereof) between the qualified fatigue-related parameters of the qualification dataset and the corresponding fatigue-related parameters of the verification dataset.

Methods include building a predictive model for structural repair during heavy maintenance with a training dataset of the verified and qualified fatigue-related parameters calculated from data collected during additional flights of the fleet. Building includes calculating the training dataset and training the predictive model with the training dataset.

DESCRIPTION

Figure 1:
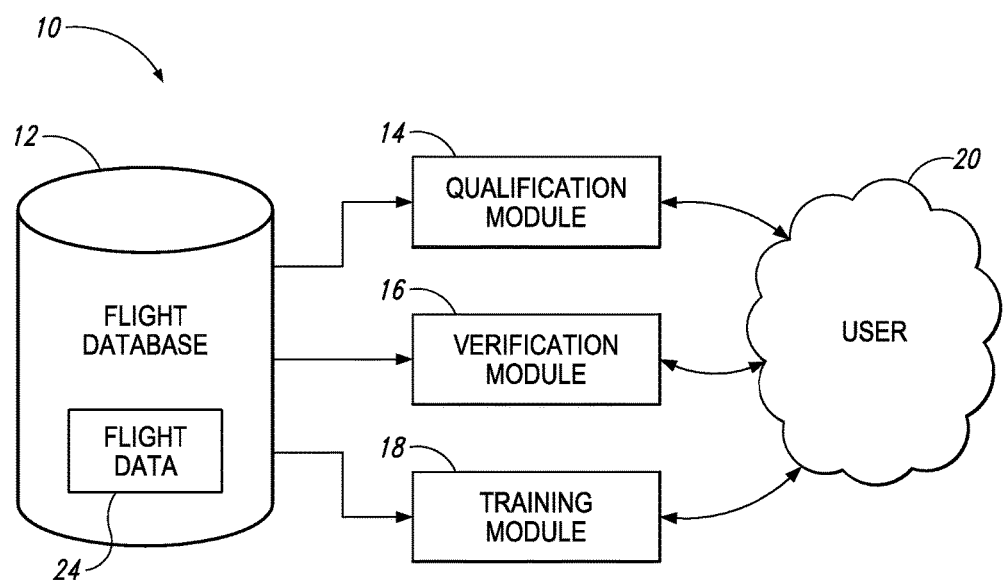
FIG. 1 is a schematic representation of a hybrid feature selection system.

Aircraft may monitor their subsystems and overall performance, and record system operation data, which may relate to structural component health. For example, aircraft may record speed, acceleration, flight time, number of take-offs and landings, number of catapults, number of traps, etc. (and/or such data may be recorded for individual aircraft). Some aircraft, such as F/A-18 Hornet model aircraft, include accelerometers and/or strain gauges to measure overall aircraft motion and stresses applied to components and/or sections of the aircraft. However, simple measures such as total flight hours, total number of traps, or peak acceleration do not reliably predict when or which structural components should be replaced. As used herein, replacement of a structural component includes installation of a different structural component (generally new or remanufactured) or repair of the original structural component. The systems and methods of the present disclosure provide a way to identify valid indicators among all of the possible measured parameters and derivative parameters, and to train and deploy predictive models for structural repair during heavy maintenance of aircraft. Measured parameters and derivative parameters may be referred to as data features or features. Predictive models for structural repair during heavy maintenance include predictive models for repair and/or replacement of structural components of an aircraft during heavy maintenance.

For complex systems like aircraft, the amount and complexity of the operation data is overwhelming for people to efficiently analyze. Also, the raw data may be an inefficient starting point for computerized systems (e.g., machine learning systems). Computerized systems may be inefficient and/or inaccurate when given only raw data because of the large amount of uncorrelated parameters in the data. User intervention may be needed to identify and remove as much of the uncorrelated data as possible. Systems and methods of the present disclosure improve the efficiency and simplify the task of feature selection by taking a hybrid approach. A human operator is relied upon to qualify potential data features, using a limited dataset, based upon operation data and the physical expectations of structural component operation. Data features qualified by the operator may be used to train a predictive model for structural repair during heavy maintenance, using a comprehensive dataset. Predictive models created by the hybrid feature selection approach may be deployed to monitor and/or assess structural component performance and reliably predict when and/or which structural components may need repair and/or replacement during heavy maintenance.

By accurately predicting future structural component status, the replacement of the structural component may be scheduled prior to induction into heavy maintenance, thus reducing potential downtime. Additionally or alternatively, demand for replacement structural components may be predicted with some reliability. The accurate prediction of structural component performance also may avoid unexpected performance of the subject structural component and sympathetic performance responses from related components or subsystems (e.g., due to the added stress of a non-performing structural component in a complicated aircraft).

FIGS. 1-5 illustrate various aspects of hybrid feature selection systems and methods for prediction of structural repair during heavy maintenance of aircraft. In general, in the drawings, elements that are likely to be included in a given embodiment are illustrated in solid lines, while elements that are optional or alternatives are illustrated in dashed lines. However, elements that are illustrated in solid lines are not essential to all embodiments of the present disclosure, and an element shown in solid lines may be omitted from a particular embodiment without departing from the scope of the present disclosure. Elements that serve a similar, or at least substantially similar, purpose are labeled with numbers consistent among the figures. Like numbers in each of the figures, and the corresponding elements, may not be discussed in detail herein with reference to each of the figures. Similarly, all elements may not be labeled or shown in each of the figures, but reference numerals associated therewith may be used for consistency. Elements, components, and/or features that are discussed with reference to one or more of the figures may be included in and/or used with any of the figures without departing from the scope of the present disclosure.

The flowcharts and block diagrams described herein illustrate the architecture, functionality, and operation of possible implementations of systems, methods, and computer program products according to various embodiments. In this regard, each block in the flowcharts or block diagrams may represent a module, segment, or portion of code, which comprises one or more executable instructions for implementing the specified logical function or functions. In some alternative implementations, the functions noted in a block may occur out of the order noted in the drawings. For example, the functions of two blocks shown in succession may be executed substantially concurrently, or the functions of the blocks may sometimes be executed in the reverse order, depending upon the functionality involved.

Figure 5:
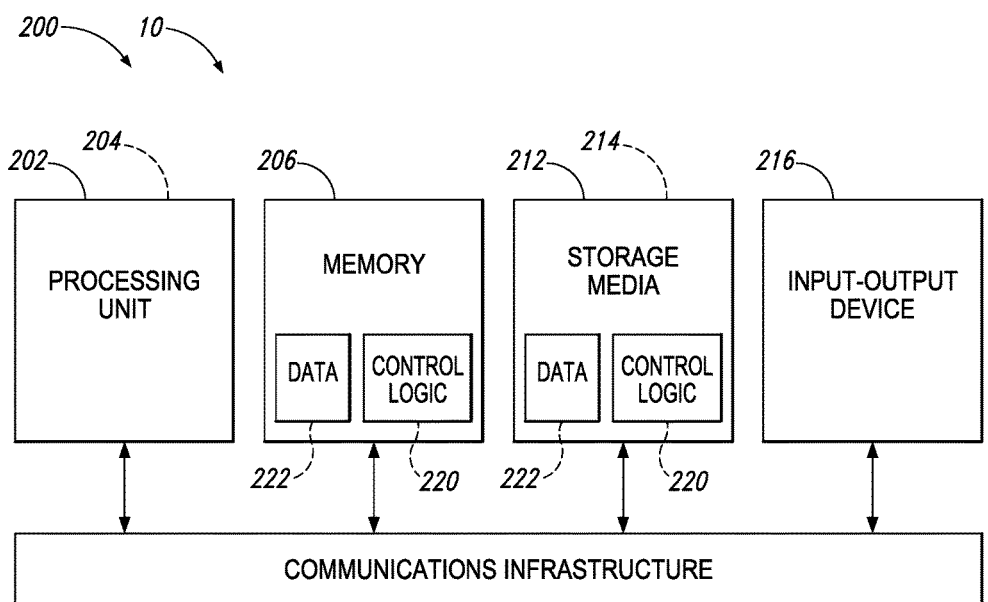
FIG. 5 is a schematic representation of a computerized system.

As schematically represented in FIG. 1, a hybrid feature selection system 10 includes several modules (e.g., instructions and/or data configured to be executed by a computerized system as described with respect to FIG. 5). These modules (which also may be referred to as agents, programs, processes, and/or procedures) may include a qualification module 14, a verification module 16, and a training module 18.

The hybrid feature selection system 10 may include and/or may utilize a flight database 12 that includes flight data 24 from one or more flights of one or more aircraft (e.g., a fleet of aircraft). The hybrid feature selection system 10 may interact with a user 20 to qualify and verify data features of the flight data 24 and to apply the identified data features to train a predictive model for structural repair during heavy maintenance.

The hybrid feature selection system 10 may be part of a health management system and/or a health assessment system for the associated aircraft or fleet of aircraft. Additionally or alternatively, the hybrid feature selection system 10 may be utilized to create predictive models for a health management system and/or a health assessment system. The health management system and/or the health assessment system may be configured to monitor, assess, and/or indicate the operational status (e.g., the expected remaining service life) of one or more structural components of the aircraft or fleet of aircraft.

Figure 2:
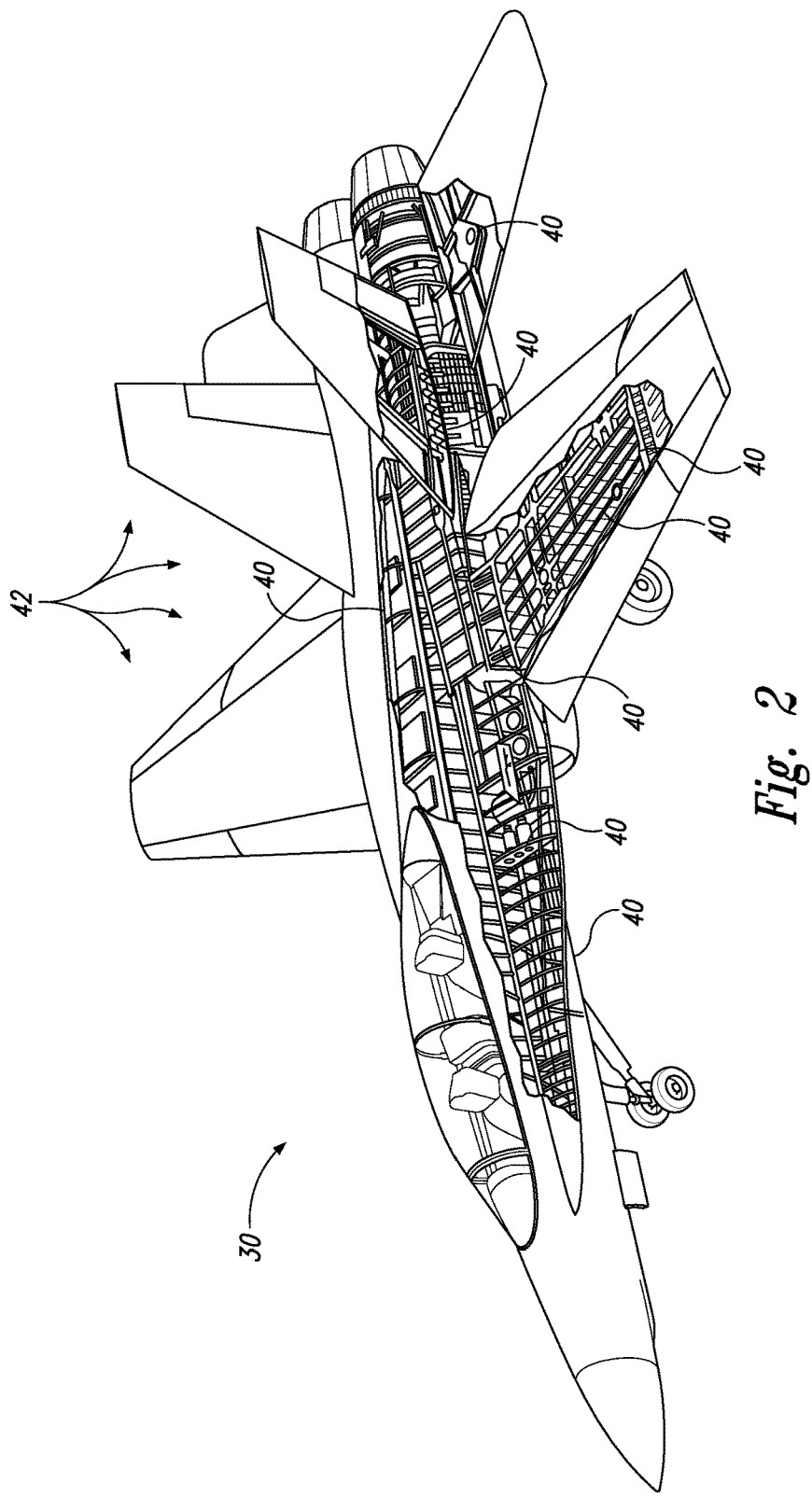
FIG. 2 is a schematic illustration of an example of an aircraft.

As illustrated in the example of FIG. 2, aircraft 30 are vehicles configured for flight and include structural components 40 such as airframe components (e.g., a frame member, a longeron, a stringer, a former, a strut, a beam, a web, a support, a linkage, a splice, and/or a panel) and sensors 42 (such as accelerometers and strain gauges). In FIG. 2, several different types of structural components 40 are indicated. Structural components 40 generally are not designed and/or configured for common maintenance, repair, and/or replacement. Structural components 40 are not actively controlled systems (though structural components 40 may be a portion of an actively controlled subsystem). Over the service life of the aircraft 30, the structural components 40 may experience wear, damage, corrosion, or other types of component fatigue. In FIG. 2, sensors 42 are indicated generally as embedded in the aircraft 30. Sensors 42 may be placed to measure global parameters of the entire aircraft 30 (e.g., accelerometers configured to measure the net acceleration of the aircraft and/or specific acceleration along a direction or about a rotational axis). Additionally or alternatively, sensors 42 may be placed to measure local parameters relating to the aircraft 30 (e.g., strain gauges at specific structures, temperature sensors at specific locations). Sensors 42 may be configured to measure parameters relating to one or more structural components 40. However, sensors 42 do not necessarily measure parameters relating to structural components 40 known or expected to need service during heavy maintenance.

Generally, sensors 42 are configured to collect data during flight of the aircraft 30 (including potentially pre-flight, take-off, active flight, landing, and/or post-flight phases of the flight). The data collected is referred to as flight data. Data may include records of environmental conditions (e.g., temperature, pressure, humidity), aircraft operation (e.g., airspeed, acceleration, altitude, ground location, angle of attack), and aircraft stresses (e.g., acceleration, local strain). In particular, one or more sensors 42 are configured to measure the presence of an overstress event. An overstress event is an event that subjects the aircraft 30 to stresses at or exceeding operational design limits. For example, an overstress event may subject the aircraft 30 to an acceleration outside of a design range (i.e., a positive acceleration above a predetermined positive acceleration threshold or a negative acceleration below a predetermined negative acceleration threshold). As another example, an overstress event may be a hard landing (i.e., a landing in which the peak landing force magnitude is greater than a landing force threshold and/or a duration of application of a landing force is greater than a threshold time). Some aircraft designs have industry accepted and/or manufacturer prescribed definitions for acceleration limits and hard landings. For example, the F/A-18 model aircraft records event codes of hard landing level 1, hard landing level 2, aircraft positive overstress, and aircraft negative overstress, each of which indicate an overstress event.

Though examples may refer to structural components 40 and to aircraft 30, the systems and methods of this disclosure may be utilized with other apparatuses. For example, systems and methods of the present disclosure may be applied to other vehicles and/or machinery. Hence, a reference to aircraft 30 may be replaced with a reference to a vehicle and/or machinery. Corresponding terms like flight may be replaced by terms like excursion and/or operation; flying may be replaced by driving, operating, and/or running.

As used herein, the term 'fleet' refers to one or more of the subject vehicles and/or machinery. A fleet may refer to all of the subject vehicles and/or machinery at a location, based at a location, used for a similar purpose, and/or used by a corporate entity (e.g., a corporation, a military unit).

For a fleet of aircraft, each aircraft 30 may be substantially identical and include the same types of structural components 40. As used herein, structural components 40 of the same type are structural components 40 in equivalent locations, serving equivalent functions in the different aircraft 30.

Returning to FIG. 1, hybrid feature selection system 10 is configured and/or programmed to analyze flight data 24 within the flight database 12. The flight database 12 is configured to search and to access the stored flight data 24. Flight data 24 is data collected during at least one flight of one or more aircraft and relates to the performance of the respective aircraft during the respective flight(s). Flight data 24 generally includes data measured by sensors in and/or associated with the aircraft. Flight data 24 may include the raw data as recorded by the sensors, processed data derived from the raw sensor data (e.g., applying an offset, an average, a filter, etc.), and/or supplemental data related to the aircraft, flight, subsystem, sensor, and/or subject structural component (e.g., ID number, functional state (e.g., on/off), time stamp, weather conditions, etc.).

Flight data 24 may be collected during a group of flights. Flights may or may not be sequential or every flight of an aircraft within a period of time. Flight data 24 that is selected for analyzing the structural system may be selected according to whether the aircraft experienced particular events such as overstress events.

Flight data 24 within the flight database 12 includes data collected for one or more aircraft. For aircraft that were inducted into heavy maintenance, the flight data 24 may be collected before and/or after induction into heavy maintenance. Flight data 24 may include data relating to aircraft that have never experienced heavy maintenance.

Examples of flight data 24 include an indication of weight on wheels, sensor status (e.g., operating normally, degraded performance, non-responsive), subsystem settings (e.g., auto flight control, flap positions), component settings (e.g., an actuator command position), sensor values (e.g., acceleration, strain), airspeed, engine throttle, a temperature, a pressure, a voltage, a current, ambient temperature, and/or ambient pressure. Flight data 24 may be collected systematically, e.g., consistently on substantially every flight, consistently in substantially every aircraft, and/or on a consistent basis (e.g., periodically or upon a predetermined event). Flight data 24 relating to different sensors may be collected at different times or at substantially the same time. Flight data 24 relating to the same sensor generally forms a time series (e.g., periodic, quasi-periodic, or aperiodic).

The hybrid feature selection system 10 may be utilized to identify component parameters that potentially correlate (positive correlation or negative correlation) with structural repair during heavy maintenance. Component parameters are types of flight data 24 and/or data derived from flight data 24. Component parameters may relate directly or indirectly to wear, damage, corrosion, or other types of component fatigue and hence may be referred to as fatigue-related parameters. Component parameters may relate to one or more specific structural components and/or may relate to the aircraft as a whole. Flight data values are the values corresponding to measurements of the component parameters. For example, a component parameter may be a strain in the vertical stabilizer and the corresponding data may be the strain value measured at a particular time and/or site within the aircraft subsystem. As another example, a component parameter may be an acceleration about the roll axis and the corresponding data may be the acceleration value of the aircraft at a particular time. A particular dataset may be formed from the data relating to one or more component parameters. For example, a dataset may include strain values measured by a strain sensor at a series of times during a flight of the aircraft and acceleration values measured by an accelerometer at a series of times during the same flight of the aircraft.

Component parameters may relate to data from one or more sensors, and/or may relate to data derived from one or more sensors. For example, component parameters may be a sum, a difference, a count, and/or a statistic of one or more sensor measurements and/or data derived from one or more sensors (collectively referred to as candidate component parameters). Examples of such derived component parameters include a difference between two sensor values, a cumulative time that a candidate component parameter is measured within a predetermined range, a cumulative value of a candidate component parameter, an average of a candidate component parameter, a maximum of a candidate component parameter, a minimum of a candidate component parameter, a variance of a candidate component parameter, a moving-window average of a candidate component parameter (e.g., a 500-second moving-window average), skewness of a candidate component parameter, and a kurtosis of a candidate component parameter. More specific examples include a strain of an aerodynamic structure (a stabilizer, an empennage component, a wing root, a flight control surface, and/or a speed brake), a difference of strains (e.g., fore-aft difference, left-right difference), an acceleration (e.g., linear acceleration and/or acceleration about an axis such as pitch rate, roll rate, and/or yaw rate), and/or command (and/or actual) positions of flight surfaces (e.g., angle of flaps, ailerons, slats, tabs, rudders, elevators, and/or stabilators, deployment of speed brake and/or spoilers.

Further, derived component parameters may be limited to and/or defined in one or more time windows, such as predetermined time windows or times in which a candidate component parameter is measured in a predetermined range. For example, a component parameter may be a strain when the aircraft experiences an acceleration above or below a predetermined limit, or may be a rate of change measured in successive time periods (e.g., every 1 second). Examples include a duration and/or statistic of strain above a threshold strain, a duration and/or statistic of acceleration above a threshold acceleration, a duration and/or statistic of pitch rate above a threshold pitch rate, a duration and/or statistic of roll rate above a threshold roll rate, a duration and/or statistic of yaw rate above a threshold yaw rate, and a duration of speed brake deployment.

The qualification module 14 of the hybrid feature selection system 10 is configured and/or programmed to calculate a qualification dataset based on an initial group of component parameters that may be related to structural component replacement during heavy maintenance (also called fatigue-related parameters), to display the qualification dataset, and optionally to receive a selection of the initial group of component parameters, as described further herein with respect to the methods of the present disclosure. The qualification dataset is calculated from the initial group of component parameters from data collected during a first group of flights of an aircraft in which the aircraft experienced an overstress event. The data collected includes data from at least before the aircraft experienced heavy maintenance and the outcome of the heavy maintenance (i.e., which structural components were replaced during heavy maintenance). Thus, the qualification dataset may be utilized to identify potential positive correlations (indicating which structural component(s) needed replacement). Additionally or alternatively, the qualification dataset may be utilized to discern whether any potential correlations observed in the verification dataset are likely true or false correlations (e.g., correlated with the structural component replacement, or a random event), as discussed further herein. The initial group of component parameters may be user 20 selected and may represent component parameters expected to correlate (positive correlation or negative correlation) with the structural component replacement during heavy maintenance.

Upon review of the displayed qualification dataset, the user 20 may recognize potential correlations between the replacement of the structural component during heavy maintenance and one or more of the component parameters. If the user 20 does recognize potential (positive or negative) correlations, the user 20 may select those component parameters that indicate a potential correlation (providing a selection of the component parameters to the hybrid feature selection system 10). If the user 20 does not recognize potential correlations and/or sufficient potential correlations, the user 20 may operate the qualification module 14 with a different group of component parameters in an effort to discover potential correlations and/or a sufficient number of potential correlations. The component parameters selected by the user 20 based on potential correlations are component parameters with positive correlation (indicating a structural component replacement) and/or negative correlation (indicating lack of a structural component replacement) to the heavy maintenance outcome; however, the correlation may be a true correlation (correlating with the structural component replacement, and not another randomly correlated event) or a false correlation (correlating with a randomly correlated event). Generally, potential positive correlations (indicating a structural component replacement) and false negative correlations are more readily identified with the qualification module 14 and the qualification dataset because the qualification dataset includes data from aircraft that are known to have undergone a structural component replacement during heavy maintenance.

The verification module 16 of the hybrid feature selection system 10 is configured and/or programmed to calculate a verification dataset based on the selection of component parameters (as received from the user 20), to display the verification dataset, and optionally to receive a set of the selection of the component parameters, as described further herein with respect to the methods of the present disclosure. The verification dataset is calculated from the selection of component parameters from data collected during a second group of flights of a second aircraft. The second aircraft experienced heavy maintenance like the first aircraft but the structural component that was replaced in the first aircraft was not replaced during heavy maintenance of the second aircraft. The verification dataset may be calculated from the selection of parameters from data collected from more than one groups of flights and/or from more than one aircraft.

The second group of flights is selected such that the aircraft experienced an overstress event during each of the flights of the second group of flights. Thus, the verification dataset may be utilized to discern whether the potential correlations observed in the qualification dataset are likely true correlations or false correlations. Additionally or alternatively, the verification dataset may be utilized to identify potential negative correlations.

As used herein, ordinal adjectives such as "first," "second," etc. are identifiers of the referenced object and not intended to indicate a specific order, temporal or otherwise. For example, the first aircraft is an aircraft distinguished from the second aircraft and not necessarily an older aircraft. Likewise, the first group of flights is not necessarily the first group of flights ever flown by the first aircraft or a group flown before the second series of flights. The first group of flights may be before, during, or after the second group of flights.

Upon review of the displayed verification dataset, the user 20 may recognize component parameter behavior that appears like the potential (positive or negative) correlations seen in the qualification dataset, hence indicating that the potential correlation is a false correlation. False positive correlations may be recognized if the data associated with a component parameter does not correspond to the physical expectations of operation of the associated component (e.g., the logical and/or empirical behavior). If the user 20 does recognize component parameter behavior that appears like a potential correlation, the user 20 may create a subset of component parameters from the selection of component parameters by deselecting the corresponding component parameter(s) and/or only selecting component parameter(s) that do not indicate a false correlation. Additionally or alternatively, the user 20 may select another selection of component parameters based upon the qualification dataset and operate the qualification module 14 and/or the verification module 16 with the new selection of component parameters. If the user 20 does not recognize component behavior that appears like a potential correlation, the user 20 may verify that the potential correlations seen in the qualification dataset are likely true correlations. The whole or the subset (together referred to as the set) of the selection of component parameters indicate likely true correlations and may be provided to the hybrid feature selection system 10 for further processing. Generally, false positive correlations (indicating a replacement of the structural component when no replacement occurred during heavy maintenance) and potential negative correlations are more readily identified with the verification module 16 and the verification dataset because the verification dataset includes data from an aircraft that did not have the structural component replaced during heavy maintenance.

The training module 18 of the hybrid feature selection system 10 is configured and/or programmed to calculate a training dataset based on the set of the selection of component parameters (as received from the user 20) and to train a predictive model for structural repair during heavy maintenance with the training dataset, as described further herein with respect to the methods of the present disclosure. The training dataset is calculated from the set of the selection of the component parameters from data collected during multiple flights of multiple aircraft with at least one known component non-performance event, for example by utilizing the techniques of machine learning.

Figure 3:
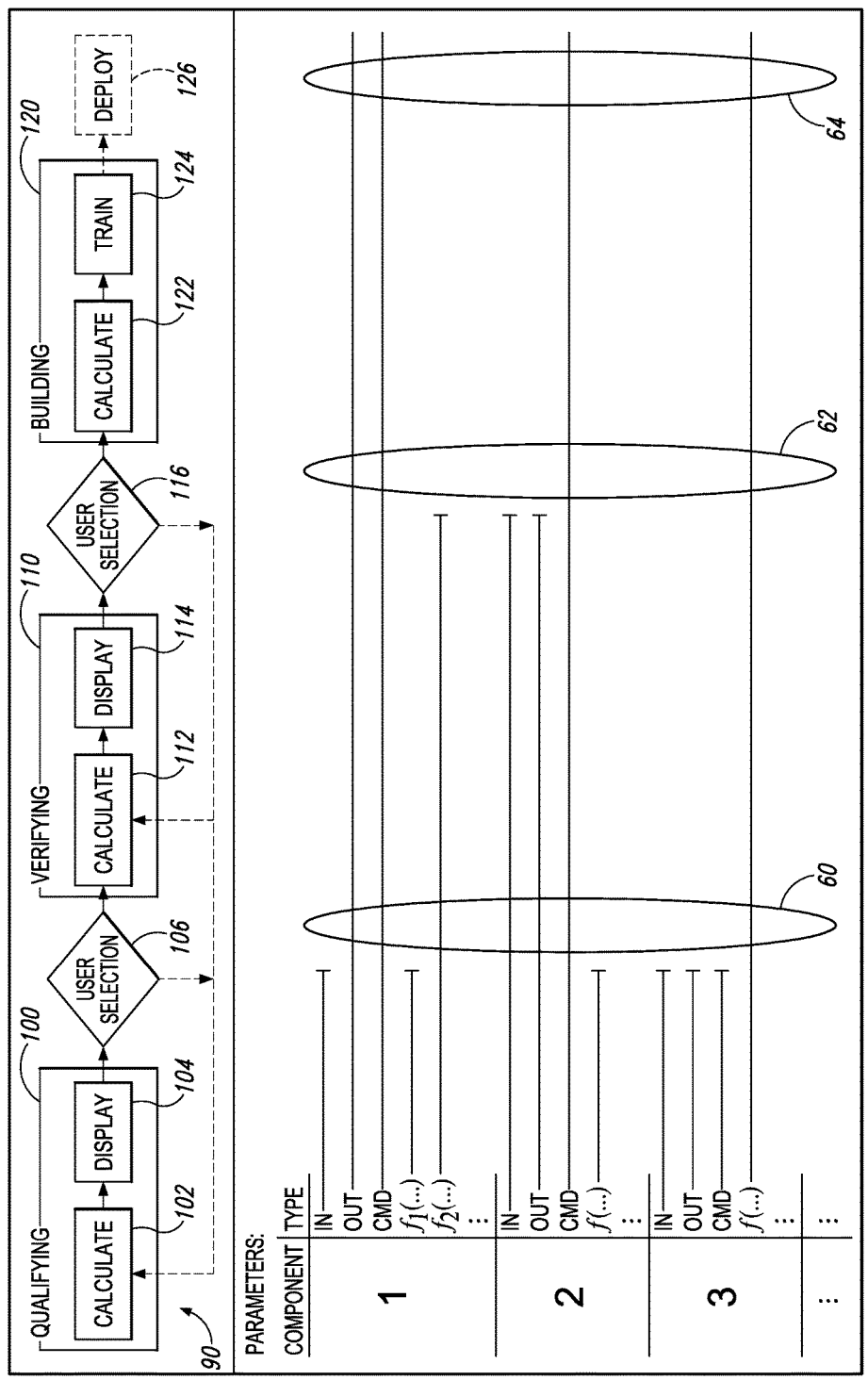
FIG. 3 is a schematic representation of methods of hybrid feature selection.

FIG. 3 schematically represents methods 90 according to the present disclosure. The upper panel illustrates an example method flow diagram. The lower panel schematically represents component parameters and the results of user selections. Methods 90 include qualifying 100 an initial group of component parameters 60, verifying 110 qualified component parameters 62, and building 120 a structural repair model based on verified and qualified component parameters 64. Qualifying 100 component parameters includes calculating 102 a qualification dataset and displaying 104 (e.g., visualizing and/or presenting) the qualification dataset. Methods 90 include receiving 106 a user selection of component parameters, referred to as the qualified component parameters 62. Verifying 110 the qualified component parameters 62 includes calculating 112 a verification dataset and displaying 114 (e.g., visualizing and/or presenting) the verification dataset. Methods 90 include receiving 116 a user-selected set of the qualified component parameters 62 (the selection of component parameters), referred to as the verified and qualified component parameters 64.

Qualifying 100 is performed with data collected during a first group of flights of a first aircraft that experienced structural repair during heavy maintenance. The qualification dataset is based on the initial group of component parameters 60. In the lower panel of FIG. 3, the initial group of component parameters 60, the qualified component parameters 62, and the verified and qualified component parameters 64 are represented as circled groups of rows of example parameters (i.e., fatigue-related parameters) related to one or more structural components of the aircraft. Calculating 102 includes calculating the qualification dataset of the initial group of component parameters 60 from data collected during the first group of flights. Calculating 102 may include restricting the qualification dataset to the component parameters from data collected during predetermined states or events associated with the aircraft. For example, where the structural component is associated with a flight surface of the first aircraft, calculating 102 may include restricting the qualification dataset to the fatigue-related parameters from data collected when the aircraft is in a normal or abnormal flight condition. The normal flight condition may include an aircraft airspeed greater than a minimum threshold (e.g., 80 knots) but less than a predetermined threshold (e.g., Mach 1) and/or an acceleration magnitude less than a maximum threshold (e.g., 50 feet per second squared).

Displaying 104 the qualification dataset may include creating a time domain graph of the qualification dataset. Displaying 104 may be responsive to user inputs.

Verifying 110 is performed with data collected during a second group of flights of a second aircraft that did not experience a structural repair during heavy maintenance.

Calculating 112 includes calculating the verification dataset based on the data collected during the second group of flights and the qualified component parameters 62 (the selection of component parameters) received by receiving 106 the user selection. The qualified component parameters 62 include at least one, most, or optionally all, of the initial group of component parameters 60. The subject structural component of the second group of flights and the verification dataset is the same type of or equivalent structural component as the subject structural component of the first group of flights and the qualification dataset.

Receiving 106 the user selection of component parameters may be based on the user's determination of potential correlations within the qualification dataset. Optionally, for example if the user does not determine potential correlations and/or sufficient potential correlations within the qualification dataset, methods 90 may include repeating the qualifying 100 with a different group of initial component parameters 60. Methods 90 may include repeating the qualifying 100 until the user selects the qualified component parameters 62 and provides the qualified component parameters 62 at the receiving 106.

Calculating 112 may include processing the data collected during the second group of flights in substantially the same (or the same) manner as the qualification dataset.

Displaying 114 the verification dataset may include creating a time domain graph of the verification dataset. Displaying 114 may be responsive to user inputs.

Receiving 116 the user-selected set of the qualified component parameters 62 may be based on the user's determination of likely true positive and/or negative correlations within the verification dataset and qualification dataset. Optionally, for example if the user does not determine likely true correlations and/or sufficient likely true correlations within the verification dataset, methods 90 may include repeating the qualifying 100 with a different group of initial component parameters 60 and/or repeating the verifying 110 with a different group of qualified component parameters 62. Methods 90 may include repeating the qualifying 100 and/or verifying 110 until the user selects the verified and qualified component parameters 64 and provides the verified and qualified component parameters 64 at the receiving 106.

Correlations may be positive correlations, in which the component parameter indicates the structural repair of the structural component during heavy maintenance, or negative correlations, in which the component parameter indicates the absence of structural repair of the structural component during heavy maintenance. Methods 90 may include seeking, and/or the user may seek, component parameters with potential positive correlations to structural repairs, which may boost the accuracy of true positive predictions of a predictive model (correctly predicting a structural repair will occur), and/or component parameters with potential negative correlations to structural repairs, which may boost the accuracy of true negative predictions of a predictive model (correctly predicting a structural repair will not occur). A component parameter may be useful for indicating true positives, true negatives, or both. Methods 90 may include identifying potential positive correlations and verifying true positive correlations, and may include identifying potential negative correlations and verifying true negative correlations. Qualifying 100 (and the ensuing receiving 106) may be performed before (as generally described), after, and/or at least partially concurrently with verifying 110 (and the ensuing receiving 116). For example, verifying 110 may be performed first to identify potential negative correlations and qualifying 100 may be performed subsequently to verify likely true negative correlations.

Building 120 the component performance model includes calculating 122 a training dataset based on the verified and qualified component parameters 64, and training 124 a predictive model for component performance with the training dataset.

Building 120 is performed with data collected during flights of aircraft of the fleet of aircraft. The flights may include one or more flights from the first group of flights and/or the second groups of flights. The aircraft may include the first aircraft (before and/or after the structural component replacement during heavy maintenance), the second aircraft, and/or other aircraft.

Calculating 122 includes calculating the training dataset based on the data collected during the as-described flights and the verified and qualified component parameters 64 (the set of the selection of component parameters) received by receiving 116. The verified and qualified component parameters 64 include at least one, most, or optionally all, of the qualified component parameters 62, provided that the verified and qualified component parameters 64 include less than all of the initial group of component parameters 60. The subject structural component of the training dataset is the same type or equivalent structural component as the subject of the qualification dataset and the verification dataset.

Calculating 122 may include processing the data collected during the flights in substantially the same (or the same) manner as the verification dataset and/or the qualification dataset.

Building 120 includes training 124 the predictive model for component performance with the training dataset, for example, by applying machine learning to the training dataset. Training 124, additionally or alternatively, may include applying a deterministic algorithm (such as linear or non-linear regression, and/or parametric modeling) to the training dataset to form the predictive model. The trained, predictive model may be referred to as the trained model (as described herein with reference to FIG. 4).

Training 124 may include supervised and/or unsupervised machine learning. The corresponding training dataset may include training signals (also referred to as labels) that may include known outcomes (e.g., the occurrence of structural repair during heavy maintenance) for one or more flights. Additionally or alternatively, the training 124 may include feedback based on training signals. Machine learning may be applied to regression problems (where the output data values are numeric, e.g., a voltage, a resistance, a strain, a number of cycles) and to classification problems (where the output data values are labels, classes, and/or categories, e.g., pass-fail, non-performance event type, etc.). For both types of problems, a broad array of machine learning algorithms are available, with new algorithms the subject of active research. For example, artificial neural networks, learned decision trees, and support vector machines are different classes of algorithms which may be applied to classification problems.

Training 124 may identify one or more candidate machine learning models. Training 124 may include selecting the candidate machine learning model with the highest performance (e.g., based upon a true positive rate, a true negative rate, a false positive rate, a false negative rate, and/or an accuracy). Additionally or alternatively, training 124 may include combining the results of the candidate machine learning models together into a meta-model. For example, the meta-model may be the weighted sum of the results of the individual candidate machine learning models. The weights in such a meta-model may be assigned according to true positive rate, true negative rate, false positive rate, false negative rate, and/or other measures of candidate model performance.

For two-class classification schemes (e.g., binary values, positive-negative, true-false, yes-no, etc.), candidate model performance may be characterized by various parameters relating to true positive, true negatives, false positives, and/or false negatives. A true positive is a 'positive' result from the candidate model when the known output value is likewise 'positive' (e.g., a 'yes' result and a 'yes' value). True positive rate, also called the sensitivity and/or the recall, is the total number of true positives divided by the total number of 'positive' output values. Positive predictive value, also called the precision, is the total number of true positives divided by the total number of 'positive' results. A true negative is a 'negative' result from the candidate model when the known output value is likewise 'negative.' True negative rate, also called the specificity, is the total number of true negatives divided by the total number of 'negative' output values. Negative predictive value is the total number of true negatives divided by the total number of 'negative' results. A false positive (also called a type I error) is a 'positive' result from the candidate model when the known output value is 'negative.' False positive rate, also called the fall-out, is the total number of false positives divided by the total number of 'negative' output values. False discovery rate is the total number of false positives divided by the total number of 'positive' results. A false negative (type II error) is a 'negative' result from the candidate model when the known output value is 'positive.' False negative rate is the total number of false negatives divided by the total number of 'positive' output values. False omission rate is the total number of false negatives divided by the total number of 'negative' results. Accuracy is the total number of true positives and true negatives divided by the total population.

Figure 4:
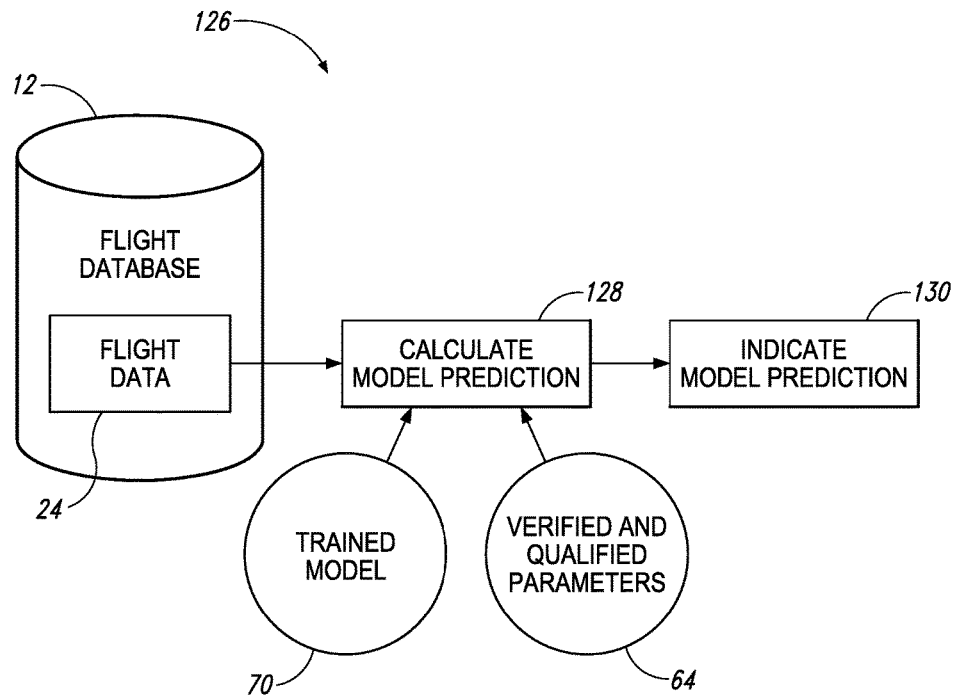
FIG. 4 is a schematic representation of methods of deploying a predictive model based on features selected according to the present disclosure.

Methods 90 may include deploying 126 the trained, predictive model for component performance to the fleet of aircraft or another fleet of similar aircraft. As shown in FIG. 4, deploying 126 includes using flight data 24 collected during flights of the associated fleet of aircraft and may include collecting the flight data 24. Flight data 24 may be stored in and/or retrieved from the flight database 12 or a flight database related to the associated fleet.

Deploying 126 includes calculating 128 (e.g., classifying) a model prediction of structural repair during heavy maintenance based on the flight data 24, the trained model 70 (from training 124), and at least a portion of the verified and qualified component parameters 64. Calculating 128 includes calculating a testing dataset of the at least a portion of the verified and qualified component parameters 64 from the flight data 24.

Calculating 128 may include processing the new flight data 24 in the same manner as the training dataset, the verification dataset, and/or the qualification dataset. For example, calculating 128 generally includes selecting flights based upon whether an overstress event occurred. Calculating 128 generally includes extracting feature data from the flight data 24 based upon at least a portion of the verified and qualified component parameters 64. Calculating 128 generally includes applying one or more classifiers (e.g., an ensemble or related classifiers) based upon the classifier(s) of the trained model 70. Calculating 128 may further include aggregating individual classifier indicators of the trained model 70 according to the prescription of the trained model 70.

Aggregating may include setting (i.e., equating) the aggregate indicator to one of a maximum value of the classifier indicators, a minimum value of the classifier indicators, a median value of the classifier indicators, an average value of the classifier indicators, a mode of the classifier indicators, a most common value of the classifier indicators, and a cumulative value of the classifier indicators. Where one or more of the classifier indicators is a non-Boolean type (e.g., a real value such as a probability metric), aggregating may include classifying such non-Boolean classifier indicators as one of two states (e.g., an operational state or a non-operational state).

Calculating 128 may include extracting feature data from flight data collected during a flight of the aircraft. As described herein, flight data and/or feature data may relate to the performance of the aircraft, a subsystem of the aircraft that includes the selected structural component, and/or the selected structural component. Extracting may include determining a statistic of sensor values during a time window, a difference of sensor values during a time window, and/or a difference between sensor values measured at different locations and/or different points in time.

Deploying 126 includes indicating 130 the model prediction. The model prediction may include, and/or may be, a classification of component status (e.g., operational, good, heavy maintenance advised, expected structural repair during heavy maintenance, and/or non-operational) and/or an estimate of remaining useful life (e.g., number of hours before heavy maintenance is advised). Indicating 130 may include displaying the model prediction to the aircraft operator and/or service personnel. Indicating 130 may be integrated with a health management system and/or a health assessment system for the associated aircraft (on-platform or off-platform). The health management system and/or the health assessment system may be configured to monitor, assess, and/or indicate the operational status of one or more structural components of the aircraft.

Deploying 126 may include collecting flight data during a flight of the aircraft. Collecting may include collecting flight data for a group of flights. Deploying 126 may include flying the aircraft. Flying the aircraft may cause collecting. Flying may include routine flying or flying to stress and/or to test the aircraft, the subsystem including the selected component, and/or the selected component.

Deploying 126 may include displaying the aggregate indicator (and/or a representation relating to the aggregate indicator) by visual, audio, and/or tactile display, for example, by utilizing and/or operating the input-output device 216.

Deploying 126 may include determining the performance status of the selected structural component based upon the aggregate indicator. Determining may include determining whether structural repair during heavy maintenance is likely or not. Determining may include determining the state of the aggregate indicator and/or evaluating the value of the aggregate indicator relative to a predetermined limit (e.g., less than, greater than, and/or about equal to the limit). For example, the need for maintenance may be associated with aggregate indicators indicating an impending-non-performance state with a likelihood greater than a predetermined limit.

Deploying 126 may further include performing heavy maintenance for replacement of the selected structural component. Deploying 126 may include determining whether to perform heavy maintenance upon determining the performance status (e.g., determining that a replacement would be useful and/or warranted based upon the aggregate indicator). For example, determining whether to undergo heavy maintenance may include evaluating the value of the aggregate indicator relative to a predetermined limit (e.g., less than, greater than, and/or about equal to the limit).

FIG. 5 schematically represents a computerized system 200 that may be used to implement and/or instantiate hybrid feature selection systems 10 and components thereof, such as qualification module 14, verification module 16, training module 18, and/or flight database 12. The computerized system 200 includes a processing unit 202 operatively coupled to a computer-readable memory 206 by a communications infrastructure 210. The processing unit 202 may include one or more computer processors 204 and may include a distributed group of computer processors 204. The computerized system 200 also may include a computer-readable storage media assemblage 212 that is operatively coupled to the processing unit 202 and/or the computer-readable memory 206, e.g., by communications infrastructure 210. The computer-readable storage media assemblage 212 may include one or more non-transitory computer-readable storage media 214 and may include a distributed group of non-transitory computer-readable storage media 214.

The communications infrastructure 210 may include a local data bus, a communication interface, and/or a network interface. The communications infrastructure 210 may be configured to transmit and/or to receive signals, such as electrical, electromagnetic, optical, and/or acoustic signals.

The computerized system 200 may include one or more input-output devices 216 operatively coupled to the processing unit 202, the computer-readable memory 206, and/or the computer-readable storage media assemblage 212. Input-output devices 216 may be configured for visual, audio, and/or tactile input and/or output. Each input-output device 216 independently may be configured for only input, only output, primarily input, primarily output, and/or a combination of input and output. Examples of input-output devices 216 include monitors (e.g., video monitor), displays (e.g., alphanumeric displays, lamps, and/or LEDs), keyboards, pointing devices (e.g., mice), touch screens, speakers, buzzers, and weights.

The computerized system 200 may include a distributed group of computers, servers, workstations, etc., which each may be interconnected directly or indirectly (including by network connection). Thus, the computerized system 200 may include one or more processing units 202, computer-readable memories 206, computer-readable storage media assemblages 212, and/or input-output devices 216 that are located remotely from one another.

One or both of the computer-readable memory 206 and the computer-readable storage media assemblage 212 include control logic 220 and/or data 222. Control logic 220 (which may also be referred to as software, firmware, and/or hardware) may include instructions that, when executed by the processing unit 202, cause the computerized system 200 to perform one or more of the methods described herein. Control logic 220 may include one or more of the qualification module 14, the verification module 16, and the training module 18. Data 222 may include the flight database 12 and/or data associated with the modules and/or methods described herein.

Examples of inventive subject matter according to the present disclosure are described in the following enumerated paragraphs.

A1. A method for creating a predictive model for structural repair during heavy maintenance in a fleet of aircraft that each includes a structural component, the method comprising:

for a first aircraft of the fleet that experienced a replacement of the structural component of the first aircraft during heavy maintenance of the first aircraft:

calculating a qualification dataset of fatigue-related parameters from data collected during a first group of flights of the first aircraft, wherein each flight of the first group of flights occurred before the heavy maintenance of the first aircraft and wherein, during each flight of the first group of flights, the first aircraft experienced an overstress event;

displaying the qualification dataset;

receiving a selection of the fatigue-related parameters;

for a second aircraft of the fleet that experienced heavy maintenance without replacement of the structural component of the second aircraft:

calculating a verification dataset of the selection of fatigue-related parameters from data collected during a second group of flights of the second aircraft, wherein each flight of the second group of flights occurred before the heavy maintenance of the second aircraft and wherein, during each flight of the second group of flights, the second aircraft experienced an overstress event;

displaying the verification dataset;

receiving a set of the selection of the fatigue-related parameters, wherein the set of the selection of the fatigue-related parameters is less than all of the fatigue-related parameters;

calculating a training dataset of the set of the selection of the fatigue-related parameters from data collected during additional flights of respective aircraft of the fleet, wherein each of the respective aircraft experienced heavy maintenance, wherein each flight of the additional flights occurred before the heavy maintenance of the respective aircraft of that flight, and wherein each flight of the additional flights is a flight during which the respective aircraft experienced an overstress event; and training a predictive model for structural repair during heavy maintenance with the training dataset.

A2. The method of paragraph A1, wherein the additional flights of respective aircraft include one or more flights of the first group of flights and/or one or more flights of the second group of flights.

A3. The method of any of paragraphs A1-A2, wherein the overstress events of the flights of the first group of flights, the overstress events of the flights of the second group of flights, and the overstress events of the flights of the additional flights of the respective aircraft are each independently selected from the group consisting of a hard landing, a positive acceleration above a predetermined positive acceleration threshold, and a negative acceleration below a predetermined negative acceleration threshold.

A4. The method of any of paragraphs A1-A3, wherein the aircraft of the fleet of aircraft are F/A-18 model aircraft, and wherein the overstress events of the flights of the first group of flights, the overstress events of the flights of the second group of flights, and the overstress events of the flights of the additional flights of the respective aircraft each independently correspond to one or more event codes selected from the group consisting of a hard landing level 1, a hard landing level 2, an aircraft positive overstress, and an aircraft negative overstress.

A5. The method of any of paragraphs A1-A4, wherein the fatigue-related parameters include at least one of a strain of an aerodynamic structure, a difference of strains, an acceleration, a pitch rate, a roll rate, a yaw rate, and a speed brake deployment event.

A6. The method of any of paragraphs A1-A5, wherein the fatigue-related parameters include at least one of a duration of strain above a threshold strain, a duration of acceleration above a threshold acceleration, a duration of pitch rate above a threshold pitch rate, a duration of roll rate above a threshold roll rate, a duration of yaw rate above a threshold yaw rate, and a duration of speed brake deployment.

A7. The method of any of paragraphs A1-A6, wherein the fatigue-related parameters include a statistical measure of selected data collected during a corresponding flight and/or of any of the other fatigue-related parameters listed herein, and wherein the statistical measure is at least one of a maximum, a minimum, an average, a moving-window average, a variance, a skewness, and a kurtosis.

A8. The method of any of paragraphs A1-A7, wherein the fatigue-related parameters include at least one of a sum, a difference, a count, a value, and a statistical measure of selected data collected during a predetermined time window, and optionally wherein the time window corresponds to a duration of the overstress event of the corresponding flight of a corresponding aircraft.

A9. The method of any of paragraphs A1-A8, wherein the data collected during the first group of flights was captured on a periodic basis, a quasi-periodic basis, and/or an aperiodic basis.

A10. The method of any of paragraphs A1-A9, wherein the data collected during the second group of flights was captured on a periodic basis, a quasi-periodic basis, and/or an aperiodic basis.

A11. The method of any of paragraphs A1-A10, wherein the data collected during the additional flights of respective aircraft of the fleet was captured on a periodic basis, a quasi-periodic basis, and/or an aperiodic basis.

A12. The method of any of paragraphs A1-A11, wherein the calculating the qualification dataset includes restricting the qualification dataset to the fatigue-related parameters from data collected during the overstress event of at least one flight of the first group of flights of the first aircraft.

A13. The method of any of paragraphs A1-A12, wherein the calculating the verification dataset includes restricting the verification dataset to the selection of the fatigue-related parameters from data collected during the overstress event of at least one flight of the second group of the flights of the second aircraft.

A14. The method of any of paragraphs A1-A13, wherein the calculating the training dataset includes restricting the training dataset to the set of the selection of the fatigue-related parameters from data collected during the overstress event of at least one flight of the additional flights of the respective aircraft.

A15. The method of any of paragraphs A1-A14, wherein the displaying the qualification dataset includes, and optionally is, visualizing and/or presenting the qualification dataset.

A16. The method of any of paragraphs A1-A15, wherein the displaying the verification dataset includes, and optionally is, visualizing and/or presenting the verification dataset.

A17. The method of any of paragraphs A1-A16, wherein the displaying the qualification dataset includes creating a time domain graph of the qualification dataset.

A18. The method of any of paragraphs A1-A17, wherein the displaying the verification dataset includes creating a time domain graph of the verification dataset.

A19. The method of any of paragraphs A1-A18, wherein the displaying the qualification dataset includes displaying responsive to user inputs.

A20. The method of any of paragraphs A1-A19, wherein the displaying the verification dataset includes displaying responsive to user inputs.

A21. The method of any of paragraphs A1-A20, wherein the receiving the selection of the fatigue-related parameters is receiving from a user the selection.

A22. The method of any of paragraphs A1-A21, wherein the receiving the set of the selection is receiving from the user the set of the selection.

A23. The method of any of paragraphs A1-A22, wherein the selection of the fatigue-related parameters is less than all fatigue-related parameters.

A24. The method of any of paragraphs A1-A23, wherein the set of the selection of the fatigue-related parameters is less than all of the selection of the fatigue-related parameters.

A25. The method of any of paragraphs A1-A24, wherein the selection of fatigue-related parameters is a selection based on the user's determination of a correlation between the replacement of the structural component and the fatigue-related parameters.

A26. The method of any of paragraphs A1-A25, wherein the set of the selection of the fatigue-related parameters is a set selected from the selection based on the user's determination of a correlation between the selection of the fatigue-related parameters of the qualification dataset and the corresponding fatigue-related parameters of the verification dataset.

A27. The method of any of paragraphs A1-A26, wherein the set of the selection of the fatigue-related parameters is a set selected from the selection based upon the user's determination of a lack of a correlation between the selection of the fatigue-related parameters of the qualification dataset and the corresponding fatigue-related parameters of the verification dataset.

A28. The method of any of paragraphs A1-A27, wherein training the predictive model includes applying machine learning to the training dataset.

A29. The method of any of paragraphs A1-A28, wherein the structural component of the first aircraft and the structural component of the second aircraft are the same type of structured component and selected from the group consisting of a frame member, a longeron, a stringer, a former, a strut, a beam, a web, a support, a linkage, a splice, and a panel.

A30. The method of any of paragraphs A1-A29, further comprising deploying the predictive model for structural repair during heavy maintenance to the fleet of aircraft.

A31. The method of any of paragraphs A1-A30, further comprising calculating a structural component replacement prediction of a subject structural component of a subject aircraft based on the predictive model and flight data collected from a flight of the subject aircraft, and optionally wherein the flight of the subject aircraft is a flight during which the subject aircraft experienced an overstress event.

A31.1. The method of paragraph A31, further comprising collecting the flight data by flying the flight of the subject aircraft.

A31.2. The method of any of paragraphs A31-A31.1, further comprising replacing the subject structural component of the subject aircraft based upon the structural component replacement prediction.

A32. A computerized system comprising:
a computer-readable memory;
a processing unit operatively coupled to the computer-readable memory; and
a computer-readable storage media assemblage, wherein the storage media assemblage is operatively coupled to the computer-readable memory and includes instructions, that when executed by the processing unit, cause the system to perform the method of any of paragraphs A1-A31.2.

A33. A non-transitory computer-readable medium including instructions for causing a computer system to perform the method of any of paragraphs A1-A31.2.

B1. A hybrid feature selection system to generate a predictive model for structural repair during heavy maintenance in a fleet of aircraft that each includes a structural component, the hybrid feature selection system comprising:
a flight database of data collected during flights of aircraft of the fleet of aircraft;
a qualification module configured to retrieve qualification data from the flight database, configured to calculate a qualification dataset by applying fatigue-related parameters to the qualification data, configured to display the qualification dataset, and configured to receive, from a user, a selection of the fatigue-related parameters, wherein the qualification data is data collected during a first group of flights of a first aircraft of the fleet that experienced a replacement of the structural component during heavy maintenance of the first aircraft, wherein each flight of the first group of flights occurred before the heavy maintenance of the first aircraft, and wherein, during each flight of the first group of flights, the first aircraft experienced an overstress event;
a verification module configured to retrieve verification data from the flight database, configured to calculate a verification dataset by applying the selection of fatigue-related parameters to the verification data, configured to display the verification dataset, and configured to receive, from the user, a set of the selection of the fatigue-related parameters that is less than all of the fatigue-related parameters, wherein the verification data is data collected during a second group of flights of a second aircraft of the fleet that experienced heavy maintenance without replacement of the structural component of the second aircraft, wherein each flight of the second group of flights occurred before the heavy maintenance of the second aircraft, and wherein, during each flight of the second group of flights, the second aircraft experienced an overstress event; and
a training module configured to retrieve training data from the flight database, configured to calculate a training dataset by applying the set of the selection of the fatigue-related parameters to the training data, configured to train a predictive model for structural repair during heavy maintenance with the training dataset, and configured to provide the predictive model to the user.

B2. The hybrid feature selection system of paragraph B1 programmed to perform the method of any of paragraphs A1-A31.2.

C1. A method of determining a performance status of a structural component of an aircraft, the method comprising:
selecting a group of flights of the aircraft, wherein, during each flight, the aircraft experienced an overstress event;
extracting feature data from flight data collected during the group of flights, wherein the feature data relates to fatigue of the structural component;
applying an ensemble of classifiers configured to identify categories to which the feature data belong to produce a classifier indicator for each classifier of the ensemble of classifiers, wherein each classifier is configured to indicate a category of the structural component of the aircraft based upon the feature data;
aggregating the classifier indicators to produce an aggregate indicator that indicates an aggregate category of the structural component; and determining the performance status of the structural component based on the aggregate indicator.

C2. The method of paragraph C1, wherein the overstress events of the flights are selected from the group consisting of a hard landing, a positive acceleration above a predetermined threshold, and a negative acceleration below a predetermined threshold.

C3. The method of any of paragraphs C1-C2, wherein the aircraft is an F/A-18 model aircraft, and wherein the overstress events of the flights correspond to one or more event codes selected from the group consisting of a hard landing level 1, a hard landing level 2, an aircraft positive overstress, and an aircraft negative overstress.

C4. The method of any of paragraphs C1-C3, wherein the feature data include at least one of a strain of an aerodynamic structure, a difference of strains, an acceleration, a pitch rate, a roll rate, a yaw rate, and a speed brake deployment event.

C5. The method of any of paragraphs C1-C4, wherein the feature data include at least one of a duration of strain above a threshold strain, a duration of acceleration above a threshold acceleration, a duration of pitch rate above a threshold pitch rate, a duration of roll rate above a threshold roll rate, a duration of yaw rate above a threshold yaw rate, and a duration of speed brake deployment.

C6. The method of any of paragraphs C1-C5, wherein the feature data include a statistical measure of selected flight data collected during one or more (optionally all) flights of the group of flights and/or of any of the other feature data listed herein, and wherein the statistical measure is at least one of a maximum, a minimum, an average, a moving-window average, a variance, a skewness, and a kurtosis.

C7. The method of any of paragraphs C1-C6, wherein the feature data include at least one of a sum, a difference, a count, a value, and a statistical measure of selected flight data collected during a predetermined time window, and optionally wherein the time window corresponds to a duration of the overstress event of one of the flights of the group of flights.

C8. The method of any of paragraphs C1-C7, wherein the feature data include selected flight data restricted to a duration of the overstress event of one of the flights of the group of flights.

C9. The method of any of paragraphs C1-C8, further comprising collecting the flight data during the group of flights.

C9.1. The method of paragraph C9, wherein the collecting the flight data includes flying the flights of the aircraft.

C9.2. The method of any of paragraphs C9-C9.1, wherein the collecting includes capturing one or more types of flight data on a periodic basis, a quasi-periodic basis, and/or an aperiodic basis.

C10. The method of any of paragraphs C1-C9.2, wherein the structural component of the aircraft is selected from the group consisting of a frame member, a longeron, a stringer, a former, a strut, a beam, a web, a support, a linkage, a splice, and a panel.

C11. The method of any of paragraphs C1-C10, wherein the aggregate indicator indicates a likelihood of repair need of the structural component during heavy maintenance.

C12. The method of any of paragraphs C1-C11, further comprising replacing the structural component of the aircraft based upon the performance status and/or the aggregate indicator.

C13. The method of any of paragraphs C1-C12, wherein the performance status relates to whether heavy maintenance is advised.

C14. The method of any of paragraphs C1-C13, further comprising performing heavy maintenance on the aircraft based upon the performance status and/or the aggregate indicator.

C15. The method of any of paragraphs C1-C14, wherein at least one, and optionally each, classifier is formed by at least one of a naïve Bayes classifier, a support vector machine, a learned decision tree, an ensemble of learned decision trees, and a neural network.

C16. The method of any of paragraphs C1-C15, wherein at least one, and optionally each, classifier includes at least one of a statistical correlation and a regression.

C17. The method of any of paragraphs C1-C16, wherein the aggregating includes setting the aggregate indicator to one of a maximum value of the classifier indicators, a minimum value of the classifier indicators, a median value of the classifier indicators, an average value of the classifier indicators, a mode of the classifier indicators, a most common value of the classifier indicators, and a cumulative value of the classifier indicators.

C18. The method of any of paragraphs C1-C17, wherein the aggregating includes classifying each classifier indicator as one of two states, wherein the states include a heavy maintenance advised state and a no heavy maintenance advised state, and wherein the aggregating includes setting the aggregate indicator to a most common state of the classifier indicators.

As used herein, the terms "adapted" and "configured" mean that the element, component, or other subject matter is designed and/or intended to perform a given function. Thus, the use of the terms "adapted" and "configured" should not be construed to mean that a given element, component, or other subject matter is simply "capable of" performing a given function but that the element, component, and/or other subject matter is specifically selected, created, implemented, utilized, programmed, and/or designed for the purpose of performing the function. It is also within the scope of the present disclosure that elements, components, and/or other recited subject matter that is recited as being adapted to perform a particular function may additionally or alternatively be described as being configured to perform that function, and vice versa. Similarly, subject matter that is recited as being configured to perform a particular function may additionally or alternatively be described as being operative to perform that function.

As used herein, the phrase, "for example," the phrase, "as an example," and/or simply the term "example," when used with reference to one or more components, features, details, structures, embodiments, and/or methods according to the present disclosure, are intended to convey that the described component, feature, detail, structure, embodiment, and/or method is an illustrative, non-exclusive example of components, features, details, structures, embodiments, and/or methods according to the present disclosure. Thus, the described component, feature, detail, structure, embodiment, and/or method is not intended to be limiting, required, or exclusive/exhaustive; and other components, features, details, structures, embodiments, and/or methods, including structurally and/or functionally similar and/or equivalent components, features, details, structures, embodiments, and/or methods, are also within the scope of the present disclosure.

As used herein, the phrases "at least one of" and "one or more of," in reference to a list of more than one entity, means any one or more of the entities in the list of entities, and is not limited to at least one of each and every entity specifically listed within the list of entities. For example, "at least one of A and B" (or, equivalently, "at least one of A or B," or, equivalently, "at least one of A and/or B") may refer to A alone, B alone, or the combination of A and B.

As used herein, the singular forms "a", "an" and "the" may be intended to include the plural forms as well, unless the context clearly indicates otherwise.

The various disclosed elements of systems and apparatuses and steps of methods disclosed herein are not required of all systems, apparatuses, and methods according to the present disclosure, and the present disclosure includes all novel and non-obvious combinations and subcombinations of the various elements and steps disclosed herein. Moreover, any of the various elements and steps, or any combination of the various elements and/or steps, disclosed herein may define independent inventive subject matter that is separate and apart from the whole of a disclosed system, apparatus, or method. Accordingly, such inventive subject matter is not required to be associated with the specific systems, apparatuses, and methods that are expressly disclosed herein, and such inventive subject matter may find utility in systems, apparatuses, and/or methods that are not expressly disclosed herein.

The invention claimed is:

1. A method for creating a predictive model for structural repair during heavy maintenance in a fleet of aircraft that each include a structural component, the method comprising:

storing, on a memory accessible to a computerized system, first sensor data from one or more first aircraft sensors of a first aircraft of the fleet, the first sensor data including one or more of environmental conditions, aircraft operations, aircraft stresses, and overstress events experienced by one or more components of the first aircraft;

for the first aircraft of the fleet that experienced a replacement of the structural component of the first aircraft during heavy maintenance of the first aircraft:

calculating, by a processing unit of the computerized system and based on the first sensor data, a qualification dataset of fatigue-related parameters from a portion of the first sensor data collected during a first group of flights of the first aircraft, wherein each flight of the first group of flights occurred before the heavy maintenance of the first aircraft and wherein, during each flight of the first group of flights, the first aircraft experienced a corresponding overstress event for the first aircraft;

displaying, by the computerized system, the qualification dataset; and receiving, by the computerized system, a selection of the fatigue-related parameters;

storing, on the memory accessible to the computerized system, second sensor data from one or more second aircraft sensors of a second aircraft of the fleet, the second sensor data including one or more of environmental conditions, aircraft operations, aircraft stresses, and overstress events experienced by one or more components of the second aircraft;

for the second aircraft of the fleet that experienced heavy maintenance without replacement of the structural component of the second aircraft:

calculating, by the processing unit and based on the second sensor data, a verification dataset of the selection of fatigue-related parameters from a portion of the second sensor data collected during a second group of flights of the second aircraft, wherein each flight of the second group of flights occurred before the heavy maintenance of the second aircraft and wherein, during each flight of the second group of flights, the second aircraft experienced a corresponding overstress event for the second aircraft;

displaying, by the computerized system, the verification dataset; and receiving, by the computerized system, a set of the selection of the fatigue-related parameters, wherein the set of the selection of the fatigue-related parameters is less than all of the fatigue-related parameters;

calculating, by the processing unit, a training dataset of the set of the selection of the fatigue-related parameters from data collected during additional flights of respective aircraft of the fleet, wherein each of the respective aircraft experienced heavy maintenance, wherein each flight of the additional flights occurred before the heavy maintenance of the respective aircraft of that flight, and wherein each flight of the additional flights is a flight during which the respective aircraft experienced a corresponding overstress event for the respective aircraft;

training, by the processing unit, a predictive model for structural repair during heavy maintenance with the training dataset;

storing the predictive model on the memory accessible to the computerized system; and deploying, by the computerized system, the predictive model for structural repair of a subject aircraft, wherein the deploying comprises:

receiving third sensor data from one or more third aircraft sensors of the subject aircraft of the fleet, the third sensor data including one or more of environmental conditions, aircraft operations, aircraft stresses, and overstress events experienced by one or more components of the subject aircraft;

extracting, by the processing unit, feature data from the third sensor data from the one or more third aircraft sensors to determine a statistic of sensor values for the subject aircraft;

determining, by the processing unit and based on the predictive model, a performance status of a subject structural component of the subject aircraft using the feature data from the third sensor; and initiating, by the processing unit and based on the performance status, a signal to a health management system associated with the subject aircraft, the health management system being configured to update a maintenance of structural components of the subject aircraft based on the signal.

2. The method of claim 1, wherein the corresponding overstress events for the first aircraft, the corresponding overstress events for the second aircraft, and the corresponding overstress events for the respective aircraft are each independently selected from the group consisting of a hard landing, a positive acceleration above a predetermined positive acceleration threshold, and a negative acceleration below a predetermined negative acceleration threshold.

3. The method of claim 1, wherein the fatigue-related parameters include at least one of a strain of an aerodynamic structure, a difference of strains, an acceleration, a pitch rate, a roll rate, a yaw rate, and a speed brake deployment event.

4. The method of claim 1, wherein the structural component of the first aircraft and the structural component of the second aircraft are the same type of structural component and selected from the group consisting of a frame member, a longeron, a stringer, a former, a strut, a beam, a web, a support, a linkage, a splice, and a panel.

5. The method of claim 1, wherein the displaying the qualification dataset includes visualizing the qualification dataset and wherein the displaying the verification dataset includes visualizing the verification dataset.

6. The method of claim 1, wherein the displaying the qualification dataset includes displaying responsive to user inputs and wherein the displaying the verification dataset includes displaying responsive to user inputs.

7. The method of claim 1, wherein training the predictive model includes applying machine learning to the training dataset.

8. The method of claim 1, wherein the selection of the fatigue-related parameters is less than all fatigue-related parameters.

9. The method of claim 1, wherein the set of the selection of the fatigue-related parameters is less than all of the selection of the fatigue-related parameters.

10. The method of claim 1, wherein the receiving the selection of the fatigue-related parameters includes receiving, from a user, the selection of the fatigue-related parameters based on the user's determination of a correlation between the replacement of the structural component of the first aircraft during heavy maintenance and the fatigue-related parameters, and wherein the receiving the set of the selection of the fatigue-related parameters includes receiving, from the user, the set of the selection of the fatigue-related parameters based on the user's determination of a lack of correlation between the selection of the fatigue-related parameters of the qualification dataset and the corresponding fatigue-related parameters of the verification dataset.

11. The method of claim 1, wherein the calculating the qualification dataset includes restricting the qualification dataset to the fatigue-related parameters from data collected during the corresponding overstress event for the first aircraft, wherein the calculating the verification dataset includes restricting the verification dataset to the fatigue-related parameters from data collected during the corresponding overstress event for the second aircraft, and wherein the calculating the training dataset includes restricting the training dataset to the fatigue-related parameters from data collected during the corresponding overstress event for the respective aircraft.

12. The method of claim 1, wherein the deploying the predictive model further comprises:
determining a plurality of indicators by applying the predictive model to a plurality of indicator values to the third sensor data from one or more third aircraft sensors of the subject aircraft of the fleet; and
aggregating the plurality of indicators to generate the performance status of the subject structural component of the subject aircraft.

13. A hybrid feature selection system to generate a predictive model for structural repair during heavy maintenance in a fleet of aircraft that each includes a structural component, the hybrid feature selection system comprising:
a flight database of data collected by one or more aircraft sensors during flights of aircraft of the fleet of aircraft, the data including one or more of environmental conditions, aircraft operations, aircraft stresses, and overstress events experienced by individual aircraft of the fleet of aircraft during flights;
at least one processing unit;
a computer-readable memory storing non-transitory computer-readable instructions that, when executed by the at least one processing unit, cause the hybrid feature selection system to:
retrieve qualification data from the flight database;
calculate a qualification dataset by applying fatigue-related parameters to the qualification data;
display the qualification dataset;
receive, from a user, a selection of the fatigue-related parameters, wherein the qualification data is data collected during a first group of flights of a first aircraft of the fleet that experienced a replacement of the structural component during heavy maintenance of the first aircraft, wherein each flight of the first group of flights occurred before the heavy maintenance of the first aircraft, and wherein, during each flight of the first group of flights, the first aircraft experienced a corresponding overstress event for the first aircraft;
retrieve verification data from the flight database;
calculate a verification dataset by applying the selection of the fatigue-related parameters to the verification data;
display the verification dataset;
receive, from the user, a set of the selection of the fatigue-related parameters that is less than all of the fatigue-related parameters, wherein the verification data is data collected during a second group of flights of a second aircraft of the fleet that experienced heavy maintenance without replacement of the structural component of the second aircraft, wherein each flight of the second group of flights occurred before the heavy maintenance of the second aircraft, and wherein, during each flight of the second group of flights, the second aircraft experienced a corresponding overstress event for the second aircraft;
retrieve training data from the flight database;
calculate a training dataset by applying the set of the selection of the fatigue-related parameters to the raining data;
train a predictive model for structural repair during heavy maintenance with the training dataset; and
provide the predictive model to the user.

14. A method of determining a performance status of a structural component of an aircraft, the method comprising:
storing first sensor data from one or more first aircraft sensors of the aircraft, the first sensor data including one or more of environmental conditions, aircraft operations, aircraft stresses, and overstress events experienced by one or more components of the aircraft;
selecting a group of flights of the aircraft, wherein, during each flight, the aircraft experienced an overstress event;
extracting feature data from a portion of the first sensor data flight data collected by the one or more first aircraft sensors during the group of flights, wherein the feature data relates to fatigue of the structural component;
applying an ensemble of classifiers configured to identify categories to which the feature data belong to produce a classifier indicator for each classifier of the ensemble of classifiers of a predictive model, wherein each classifier is configured to indicate a category of the structural component of the aircraft based upon the feature data, and wherein the predictive model is trained using:
a first data set from second sensor data collected by one or more third aircraft sensors of a second aircraft during a first group of flights of the first aircraft that experienced a replacement of the structural component during heavy maintenance of the first aircraft, wherein each flight of the first group of flights occurred before the heavy maintenance of the first aircraft and wherein, during each flight of the first group of flights, the first aircraft experienced a corresponding overstress event for the first aircraft, and a second data set from third sensor data collected by one or more third aircraft sensors of a second aircraft during a second group of flights of the second aircraft that experienced heavy maintenance without replacement of the structural component, wherein each flight of the second group of flights occurred before the heavy maintenance of the second aircraft and wherein, during each flight of the second group of flights, the second aircraft experienced a corresponding overstress event for the second aircraft;

aggregating the classifier indicators to produce an aggregate indicator that indicates an aggregate category of the structural component;

determining the performance status of the structural component based on the aggregate indicator; and initiating, based on the performance status, a signal to a health management system associated with the aircraft, the health management system being configured to update a maintenance schedule of the structural component based on the signal.

15. The method of claim 14, wherein the overstress events of the flights of the aircraft are selected from the group consisting of a hard landing, a positive acceleration above a predetermined threshold, and a negative acceleration below a predetermined threshold.

16. The method of claim 14, wherein the feature data include at least one of a strain of an aerodynamic structure, a difference of strains, an acceleration, a pitch rate, a roll rate, a yaw rate, and a speed brake deployment event.

17. The method of claim 14, wherein the feature data include at least one of a sum, a difference, a count, a value, and a statistical measure of selected flight data collected during a duration of the overstress event of one of the flights of the group of flights of the aircraft.

18. The method of claim 14, wherein the structural component of the aircraft is selected from the group consisting of a frame member, a longeron, a stringer, a former, a strut, a beam, a web, a support, a linkage, a splice, and a panel.

19. The method of claim 14, further comprising performing heavy maintenance on the aircraft based upon the performance status.

* * * * *